(12) United States Patent
Plestid

(10) Patent No.: US 8,473,231 B2
(45) Date of Patent: Jun. 25, 2013

(54) SYSTEMS AND METHODS FOR MONITORING DETERIORATION OF A RECHARGEABLE BATTERY

(75) Inventor: Thomas Leonard Trevor Plestid, Ottawa (CA)

(73) Assignee: Research In Motion Limited, Waterloo (CA)

( * ) Notice: Subject to any disclaimer, the term of this patent is extended or adjusted under 35 U.S.C. 154(b) by 0 days.

(21) Appl. No.: 13/567,163

(22) Filed: Aug. 6, 2012

(65) Prior Publication Data
US 2012/0303302 A1   Nov. 29, 2012

Related U.S. Application Data

(62) Division of application No. 12/536,659, filed on Aug. 6, 2009, now Pat. No. 8,255,176.

(60) Provisional application No. 61/086,985, filed on Aug. 7, 2008.

(51) Int. Cl.
*G01R 31/36*   (2006.01)

(52) U.S. Cl.
USPC .................. 702/63; 702/64; 702/65; 324/426; 324/427; 324/430; 324/433; 320/132; 320/107; 320/128; 320/149

(58) Field of Classification Search
USPC ................ 702/63, 64, 65; 320/132, 148, 107, 320/162, 128, 137, 115, 149, 150; 324/432, 324/426, 427, 430, 433
See application file for complete search history.

(56) References Cited

U.S. PATENT DOCUMENTS

| 5,690,685 | A  | * | 11/1997 | Kroll et al. .................. 607/5 |
| 5,862,515 | A  | * | 1/1999 | Kobayashi et al. ............. 702/63 |
| 5,904,705 | A  | * | 5/1999 | Kroll et al. .................. 607/5 |
| 6,420,851 | B1 | * | 7/2002 | Schoofs et al. ............... 320/132 |
| 6,424,123 | B1 |   | 7/2002 | Odaohhara et al. |

(Continued)

FOREIGN PATENT DOCUMENTS

| DE | 10 2005 026 583 A1 | 12/2006 |
| EP | 0 628 833 A1 | 12/1994 |

(Continued)

OTHER PUBLICATIONS

Buchmann, Isidor: "How to prolong lithium-based batteries," BatteryUniversity.com http://www.batteryuniversity.com/parttwo-34.htm, created Feb. 2003, last edited Sep. 2006, printed Feb. 8, 2008, 5 pages.

(Continued)

*Primary Examiner* — Carol Tsai
(74) *Attorney, Agent, or Firm* — Jones Day

(57) ABSTRACT

Systems and methods are provided for monitoring the deterioration of a rechargeable battery. A battery monitoring system may be used to store charging information, discharge information and storage information for a rechargeable battery to a data store. The charging information may include a number of charge cycles incurred by the rechargeable battery. The discharge information may include a number discharge cycles incurred by the rechargeable battery. The storage information may include information relating to periods when the rechargeable battery is not being actively charged or discharged. The battery monitoring system may be further used to determine an amount of deterioration of a battery performance characteristic based on the stored charging information, discharge information and storage information.

29 Claims, 8 Drawing Sheets

U.S. PATENT DOCUMENTS

| | | | |
|---|---|---|---|
| 6,522,101 B2 | 2/2003 | Malackowski | |
| 6,563,318 B2 * | 5/2003 | Kawakami et al. | 324/426 |
| 6,577,104 B2 | 6/2003 | Sakakibara | |
| 6,683,440 B2 | 1/2004 | Kawakami et al. | |
| 6,760,625 B1 * | 7/2004 | Kroll | 607/29 |
| 6,794,849 B2 * | 9/2004 | Mori et al. | 320/107 |
| 6,932,174 B2 | 8/2005 | Hirata et al. | |
| 6,982,544 B2 * | 1/2006 | Tran | 320/132 |
| 7,078,907 B2 | 7/2006 | Uesaka et al. | |
| 7,091,693 B2 * | 8/2006 | Grunert et al. | 320/107 |
| 7,091,698 B2 | 8/2006 | Yamazaki et al. | |
| 7,190,171 B2 | 3/2007 | Kawakami et al. | |
| 7,191,077 B2 | 3/2007 | Mese et al. | |
| 7,211,987 B2 | 5/2007 | Aoki et al. | |
| 7,227,335 B2 * | 6/2007 | Sakakibara et al. | 320/132 |
| 7,301,305 B2 * | 11/2007 | Tran | 320/132 |
| 7,388,383 B2 | 6/2008 | Kawakami et al. | |
| 7,466,105 B2 * | 12/2008 | Inui et al. | 320/132 |
| 7,688,075 B2 * | 3/2010 | Kelley et al. | 324/426 |
| 7,737,659 B2 | 6/2010 | Morioka | |
| 7,825,631 B2 * | 11/2010 | Chen et al. | 320/134 |
| 7,898,263 B2 * | 3/2011 | Ishida et al. | 324/430 |
| 8,040,107 B2 * | 10/2011 | Ishii | 320/132 |
| 2002/0012830 A1 * | 1/2002 | Uemura et al. | 429/60 |
| 2002/0060554 A1 * | 5/2002 | Odaohhara et al. | 320/134 |
| 2002/0101218 A1 | 8/2002 | Koenck et al. | |
| 2002/0109506 A1 | 8/2002 | Kawakami et al. | |
| 2003/0006735 A1 | 1/2003 | Kawakami et al. | |
| 2003/0057918 A1 | 3/2003 | Aoki et al. | |
| 2005/0001625 A1 | 1/2005 | Ashtiani et al. | |
| 2005/0017686 A1 * | 1/2005 | Sakakibara et al. | 320/132 |
| 2005/0035743 A1 | 2/2005 | Kawakami et al. | |
| 2005/0156570 A1 * | 7/2005 | Inui et al. | 320/132 |
| 2006/0049805 A1 * | 3/2006 | Tran | 320/149 |
| 2006/0238168 A1 | 10/2006 | Matsuo et al. | |
| 2007/0075678 A1 * | 4/2007 | Ng et al. | 320/106 |
| 2007/0120554 A1 | 5/2007 | Kawakami et al. | |
| 2007/0182373 A1 * | 8/2007 | Sakakibara et al. | 320/115 |
| 2007/0188141 A1 | 8/2007 | Hamaguchi et al. | |
| 2007/0188148 A1 | 8/2007 | Kawasumi et al. | |
| 2007/0285059 A1 | 12/2007 | Zettel et al. | |
| 2008/0007223 A1 | 1/2008 | Morioka | |
| 2010/0156351 A1 | 6/2010 | Ugaji et al. | |
| 2011/0187329 A1 | 8/2011 | Majima et al. | |
| 2011/0238344 A1 * | 9/2011 | Jin et al. | 702/63 |

FOREIGN PATENT DOCUMENTS

| | | |
|---|---|---|
| EP | 1 450 173 A2 | 8/2004 |
| EP | 1 482 318 A2 | 12/2004 |
| EP | 1 500 945 A2 | 1/2005 |
| EP | 1 990 859 A1 | 11/2008 |
| EP | 2 068 161 A2 | 6/2009 |
| WO | 2007/048367 A1 | 5/2007 |
| WO | 2007/099898 A1 | 9/2007 |

OTHER PUBLICATIONS

EPO: Extended European Search Report for Application No. 09167470.5-2216 dated Jun. 15, 2010 (16 pages).

EPO: Communication pursuant to Article 94(3) EPC for Application No. 09167470.5-2216 dated Nov. 23, 2010 (6 pages).

CIPO: Office Action issued for corresponding Canadian Patent Application No. 2,674,966 dated Aug. 28, 2012 (5 pages).

EPO: Partial European Search Report for Application No. 12195344. 2-2216 dated Feb. 4, 2013 (9 pages).

* cited by examiner

SYSTEMS AND METHODS FOR MONITORING DETERIORATION OF A RECHARGEABLE BATTERY

CROSS-REFERENCE TO RELATED APPLICATION

This is a division of U.S. application Ser. No. 12/536,659, filed Aug. 6, 2009, which claims priority from U.S. Provisional Application No. 61/086,985, filed Aug. 7, 2008, all the above applications hereby incorporated by reference.

FIELD

The technology described in this patent document relates generally to systems and devices that utilize a rechargeable battery. More particularly, systems and methods are provided for monitoring the deterioration of a rechargeable battery.

BACKGROUND

The deterioration of a rechargeable battery relates to the amount that one or more performance characteristics of the battery have degraded over time. The battery performance characteristics that are subject to deterioration include, for example, the charge capacity of the battery and the battery's equivalent series resistance (ESR). The charge capacity of the battery is a measure of the amount of energy that may be stored in the battery when fully charged. The ESR of the battery is relevant to determining the amount of current that the battery is capable of delivering. It is desirable in many systems and devices to monitor the deterioration of one or more battery performance characteristics, for instance, to determine when the rechargeable battery should be replaced.

DETAILED DESCRIPTION

Figure 1:
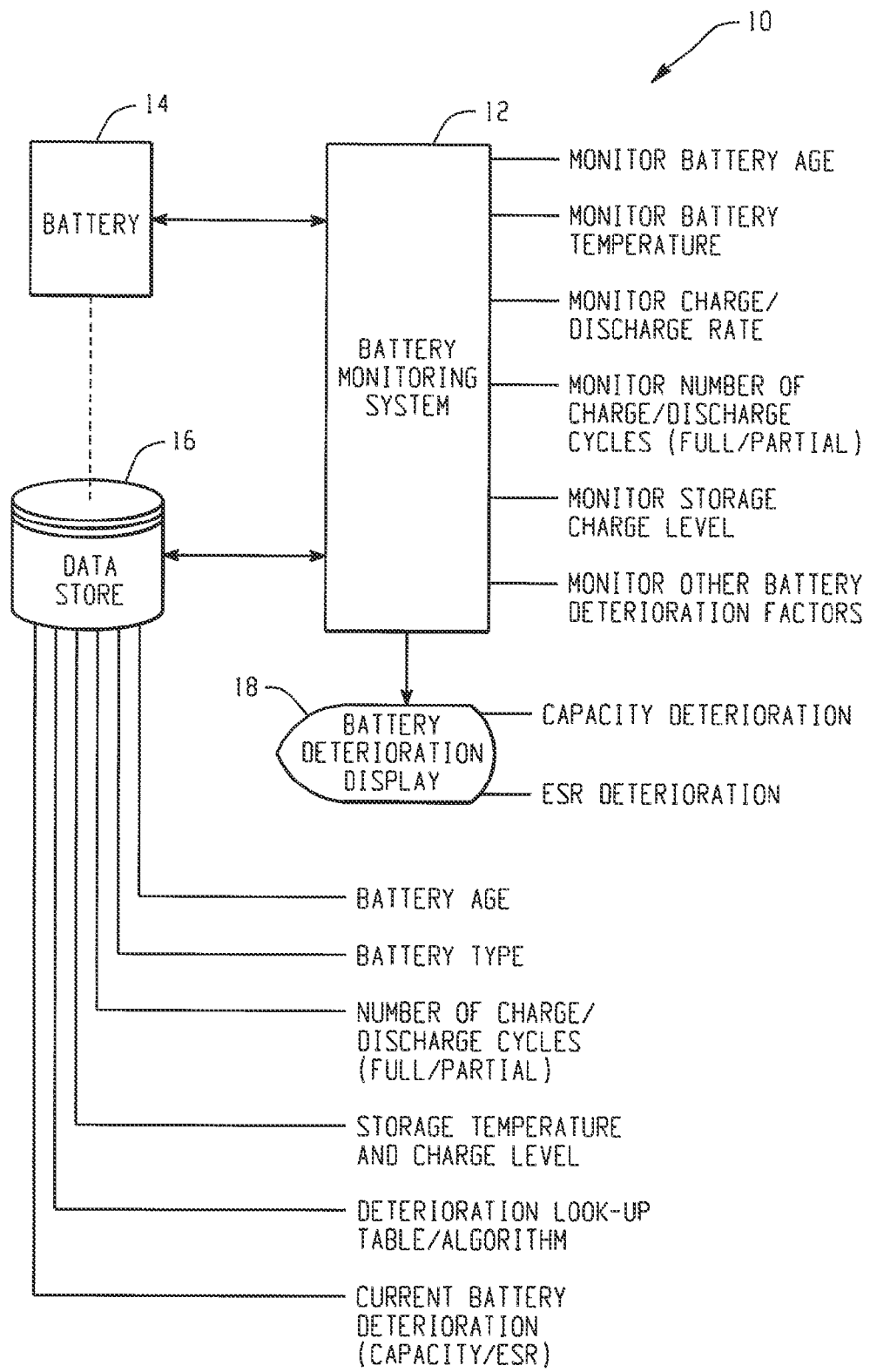
FIG. 1 is a block diagram depicting an example system for monitoring deterioration of a rechargeable battery.

FIG. 1 is a block diagram depicting an example system 10 for monitoring deterioration of a rechargeable battery. The system includes a battery monitoring system 12, a rechargeable battery 14, a data store 16, and a display 18. The system 10 depicted in FIG. 1 may, for example, be included in a mobile device, such as a cellular telephone, PDA or laptop computer. It should be understood, however, that the system 10 may also be used in other types of systems or devices that utilize a rechargeable battery.

The battery monitoring system 12 may include one or more processing devices, such as a microprocessor or DSP, and may also include one or more sensor devices for detecting operating parameters of the battery 14. For example, the battery monitoring system 12 may include sensor devices to detect the ambient temperature of the battery, the charge or discharge current of the battery, the battery voltage, and/or other operating parameters. In one example, the battery monitoring system 12 may be incorporated into the charging subsystem of a mobile device (see, e.g., FIG. 10). In other examples, however, the battery monitoring system 12 may be separate from other device systems or subsystems.

The data store 16 may be any type of non-volatile data storage device, such as a flash memory or other memory device. The dotted line between the rechargeable battery 14 and the data store 16 indicates that the data store 16 is associated with the battery 14. In one embodiment, for example, the data store 16 may be physically attached or internal to the rechargeable battery 14. In this manner, the stored information relating to the rechargeable battery 14 may be maintained even if the rechargeable battery 14 is moved from one system or device to another.

In operation, data relating to the deterioration of the rechargeable battery 14 is monitored by the battery monitoring system 12 and stored in the data store 16. The battery monitoring system 12 may also cause information relating to the battery deterioration to be shown on the display 18. Battery deterioration relates to the amount by which one or more battery performance characteristics, such as the rechargeable battery's ability to store and/or deliver a charge, have diminished over time. Battery deterioration may be caused by one or more factors that are monitored by the battery monitoring system 12 to determine the present deterioration of a battery performance characteristic. As illustrated, the battery performance characteristics may include the battery's charge capacity and/or equivalent series resistance (ESR). Both of these battery performance characteristics (capacity and ESR) are subject to deterioration over time.

The deterioration of a rechargeable battery over time is caused by the combination of numerous environmental and operational factors. An exact calculation relating to the percent deterioration of a battery performance characteristic should take all of these factors into account, and is therefore not feasible (if even possible) for most applications. However, a close approximation of the percent deterioration of a battery performance characteristic may be achieved by monitoring the factors that most dramatically affect its deterioration. As illustrated in FIG. 1, several of these factors include the age of the battery, the rate at which the battery is charged and/or discharged, the total number of charge and/or discharge cycles incurred by the battery and whether these cycles were full or partial, the battery temperature, and the charge level at which the battery is stored when not in use.

In one example, the battery monitoring system 12 may determine an amount of deterioration of a battery performance characteristic based, at least in part, on the number of charge cycles incurred by the battery 14 and the degree to which each of the charge cycles are full charge cycles or partial charge cycles. For instance, each time the battery 14 is charged, the battery monitoring system 12 may increment a count of the number of charge cycles stored in the data store 16. In addition, the battery monitoring system 12 may monitor whether the battery is fully or partially charged and include this information in the data store 16 along with the charge cycle count. The stored information relating to the number of full and partial charge cycles may then be used by the battery monitoring system 12 to determine the percent deterioration of a battery performance characteristic, for example by using a stored deterioration look-up table or algorithm that is specific to the type of battery 14.

For instance, the battery monitoring system 12 may utilize an algorithm or look-up table that associates a certain percentage of battery deterioration to every charge or discharge cycle incurred by the battery 14. The percentage of battery deterioration associated with a charge or discharge cycle may then be weighted by a predetermined amount depending on whether the charge or discharge cycle was full or partial. Even further, different weighting factors may be applied to the deterioration calculation depending on the degree to which the battery is charged or discharged during a cycle (e.g., weight A for a quarter charge, weight B for a half charge, weight C for a three-quarter charge, and weight D for a full charge).

Figure 2:
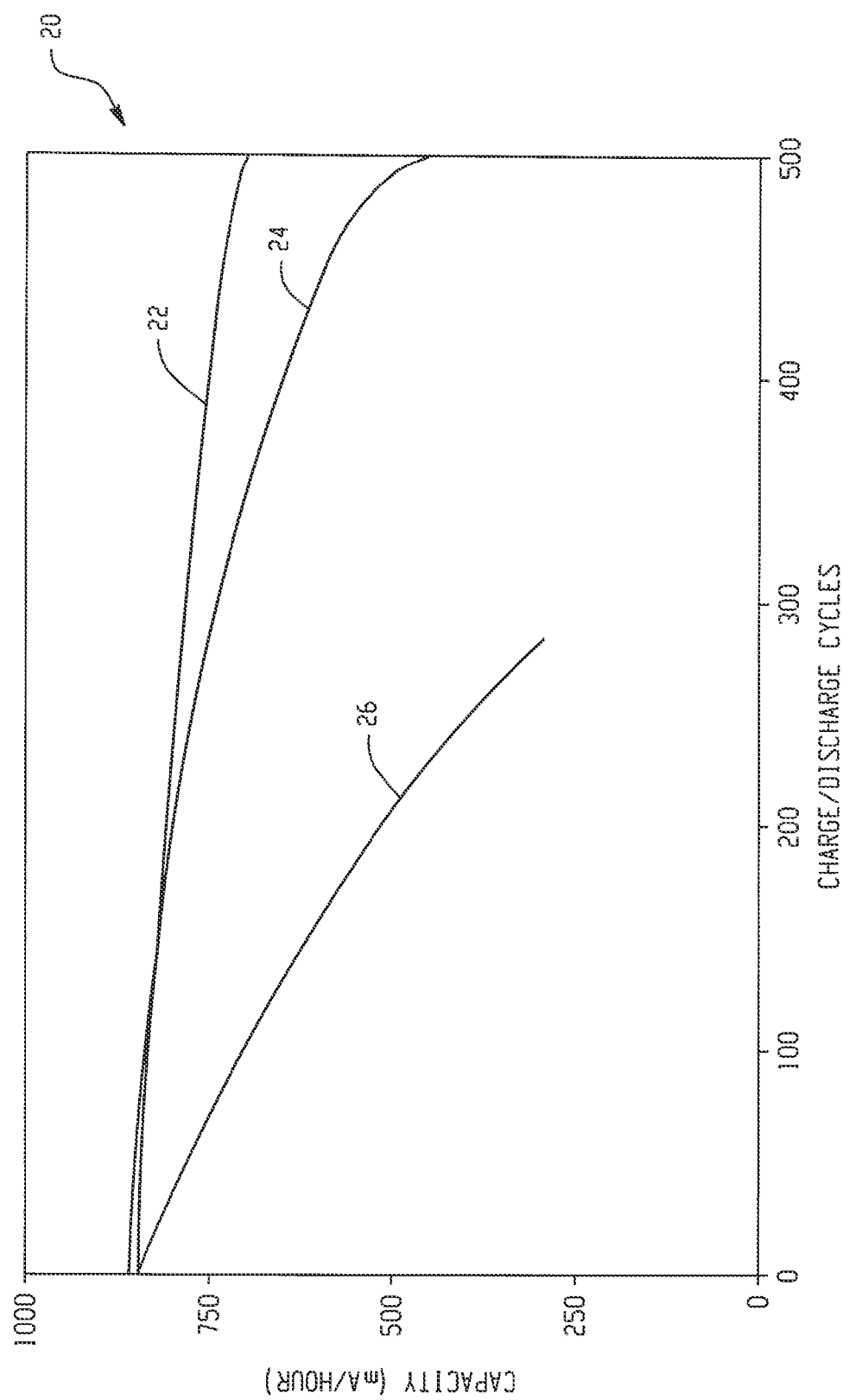
FIG. 2 is a graph illustrating how the capacity of a rechargeable battery deteriorates at different rates depending on the rate of charge or discharge.

The accuracy of the battery deterioration calculated by the battery monitoring system 12 may be improved by adding further dimensions to the look-up table or algorithm that take into consideration additional environmental or operational factors. For example, FIG. 2 is a graph 20 illustrating how the capacity of a rechargeable battery deteriorates at different rates depending on the rate of charge or discharge. In the graph 20, the uppermost curve 22 depicts battery capacity deterioration over 500 charge or discharge cycles at a slow charge and discharge rate, and curves 24 and 26 depict battery capacity deterioration at increasingly faster charge/discharge rates (with curve 26 representing the fastest of the three rates). As illustrated, the rate at which the battery deteriorates may be substantially affected by the charge and discharge rates. Accordingly, the rate at which the battery is charged and/or discharged may be included in the information monitored by the battery monitoring system 12 to determine the percent battery deterioration at a given time. For instance, the battery monitoring system 12 may store an aggregate average charge and discharge rate for the battery 14. The percentage of battery deterioration that the battery monitoring system 12 attributes to a charge or discharge cycle may then be weighted by a predetermined amount depending on the stored charge or discharge rate. This weighting parameter may, for example, be applied in addition to one or more other weighting factors (e.g., weighting for partial charge/discharge cycles).

In addition to monitoring operational and environmental factors during charge and discharge cycles, the battery monitoring system 12 may also account for battery deterioration during periods when the battery is not in use. With reference again to FIG. 1, the battery monitoring system 12 may, for example, track the battery age and storage temperature and incorporate these parameters into the overall battery deterioration calculation. A battery 12 will typically deteriorate more quickly when stored at higher temperatures. The age of the battery 14 along with the storage temperature data may thus be used to approximate how much the battery has deteriorated due to storage. This deterioration value may then be combined with the deterioration resulting from charge and discharge cycles to provide a more accurate approximation of battery deterioration. The age of the battery 14 may, for example, be tracked using an internal system clock or with reference to external data, such as a wireless network time. The temperature data may be detected and recorded by the battery monitoring system 12, or alternatively may be detected and recorded by a temperature sensing circuit on the battery itself. For instance, temperature sensors on the battery 14 may periodically record an average temperature value to the data store 16.

In another example, the battery monitoring system 12 may also monitor and record the charge level at which the battery is stored (i.e., the charge level when the battery is not being charged or discharged). For example, it is known that a LiIon battery that is stored with a partial charge deteriorates more slowly than a battery that is stored with a full charge. Therefore, storage charge level information may be used along with the battery age and storage temperature information to determine an even closer approximation of battery deterioration.

Figure 3:
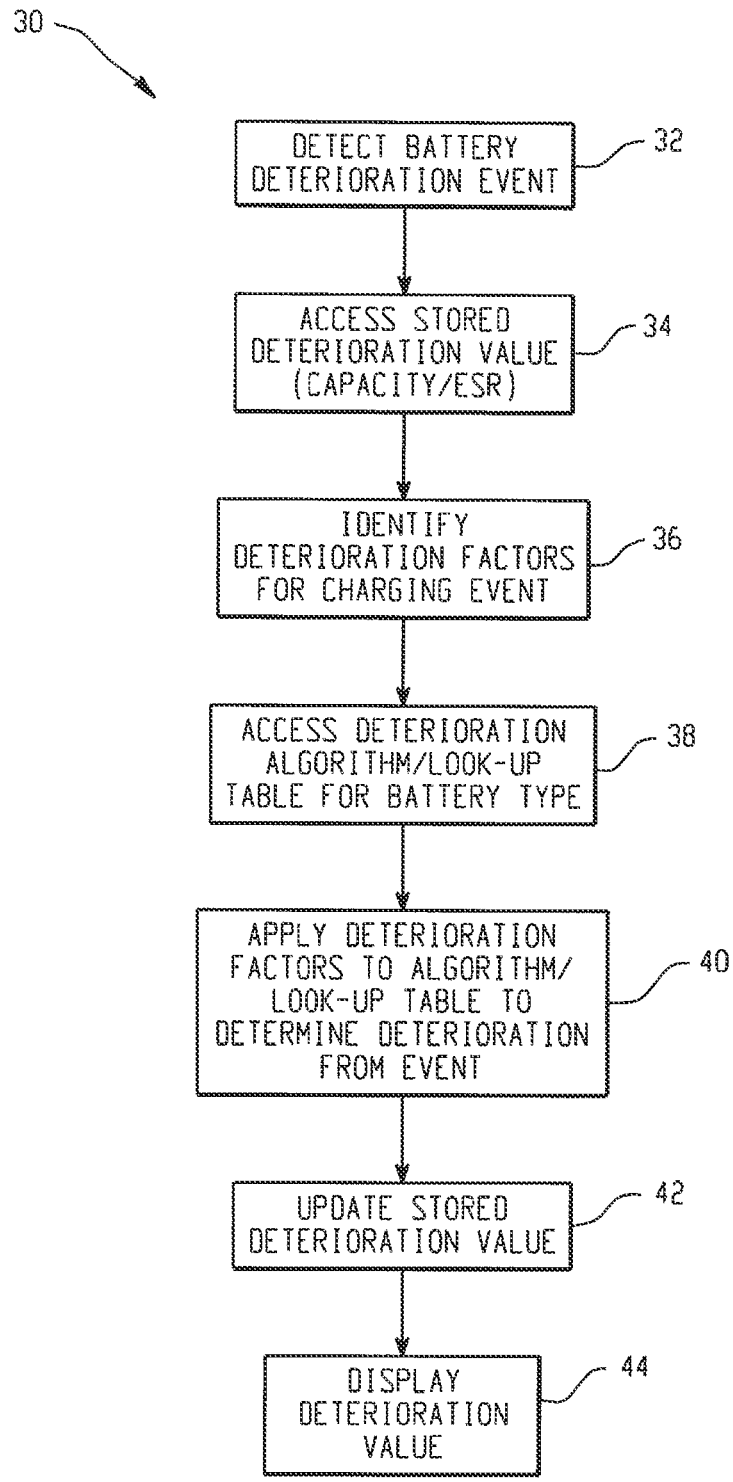
FIG. 3 is a flow diagram depicting an example method for monitoring deterioration of a rechargeable battery.

FIG. 3 is a flow diagram depicting an example method 30 for monitoring deterioration of a rechargeable battery. At step 32, the method detects a deterioration event for a rechargeable battery. The deterioration event may include either a charge cycle or a discharge cycle, where a charge cycle is detected when the battery receives a charge for a period of time and a discharge cycle is detected when the battery is discharged for a period of time. In addition, the deterioration event may also include a storage cycle, which is a period of time during which the battery is not being charged or discharged.

When a battery deterioration event is detected, the method 30 accesses a data store at step 34 to determine the last calculated deterioration value for one or more battery performance characteristics, such as battery capacity or ESR. For example, a stored deterioration value relating to battery capacity may indicate that the maximum available storage capacity of the battery has deteriorated to a certain percentage of its original value when last calculated.

In step 36, the method identifies one or more environmental or operational factors affecting the amount of deterioration caused by the battery deterioration event. For example, if the detected battery deterioration event is a charge cycle, then the method may determine whether the charge cycle is full or partial, the rate at which the battery is charged during the charge cycle, the age of the battery during the charge cycle, and/or other factors relevant to the amount of battery deterioration incurred during a charge cycle.

In step 38, the method accesses an algorithm or look-up table from memory for use in determining the amount of deterioration caused by the event. For instance, the method may select an algorithm or look-up table that is specific to the type of battery (e.g., the battery's chemical composition) and/or the type of deterioration event. In addition, different algorithms or look-up tables may be selected depending on one or more of the detected deterioration factors, such as the age of the battery, the temperature during the deterioration event and/or other factors. It should be understood that the number of stored algorithms or look-up tables and the number of dimensions in each algorithm or look-up table is a design choice that may be modified depending on the processing capabilities of the system and/or other design criteria. For instance, in one example all of the available battery deterioration events and battery deterioration factors could be incorporated into a single multi-dimensional look-up table. In other examples, however, multiple look-up tables or algorithms could be used to reduce the number of dimensions in each.

The selected algorithm or look-up table is applied in step 40, and the updated deterioration value is stored to memory in step 42 and displayed in step 44. For example, the selected algorithm or look-up table may be used to determine that the event resulted in a certain percentage of additional deterioration to the relevant battery performance characteristics. This amount may then be added to the previously stored percent deterioration and displayed on the device.

Figure 4:
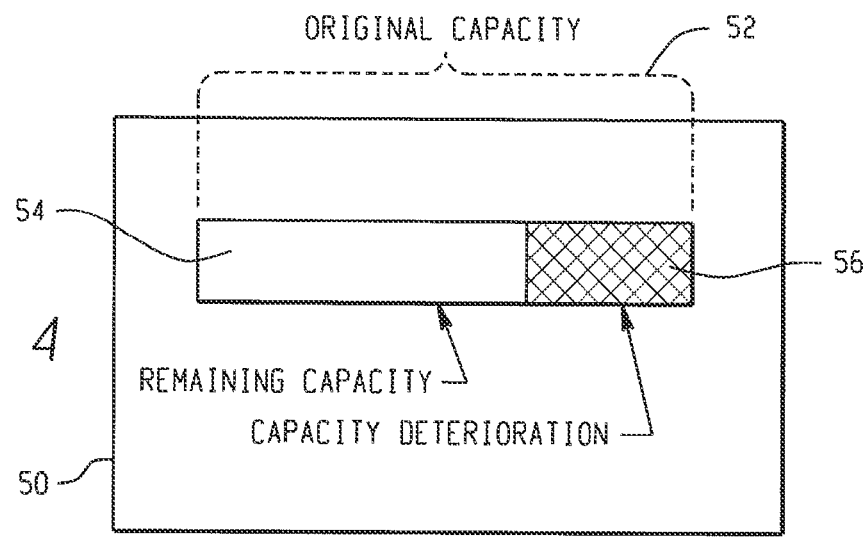
FIGS. 4-8 depict example displays relating to the deterioration of a battery performance characteristic.

Example displays relating to the deterioration of a battery performance characteristic are illustrated in FIGS. 4-8. The displays shown in FIGS. 4-8 are visual presentations that may, for example, be presented on the battery deterioration display 18 of FIG. 1. FIG. 4 illustrates an example display 50 showing the amount that a battery's maximum capacity has deteriorated over time from its original value. In this example, a graphic 52 is displayed to indicate the original capacity of the battery and to show the remaining capacity 54. A portion of the graphic 56 is grayed out to indicate the amount by which the capacity has deteriorated. The remaining capacity 54 represents the total amount of energy that may be stored by the battery when fully charged, and the capacity deterioration 56 represents the amount by which the battery's full-charge capacity has degraded over time.

Figure 5:
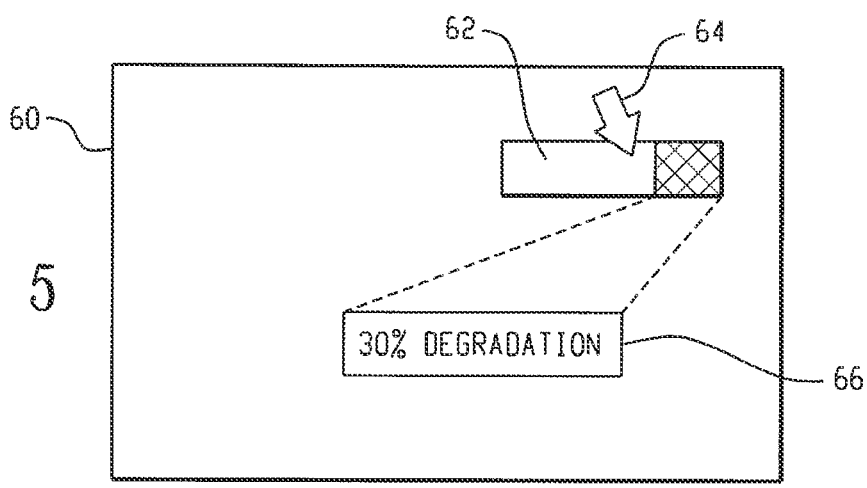

Another example of a display 60 showing the deterioration of a battery performance characteristic is illustrated in FIG. 5. In this example, a graphic 62 showing the amount of battery deterioration is displayed on a portion of the display area 60. When the user moves a cursor 64 over the graphic 62, a text box 66 is displayed that indicates the percent deterioration shown on the deterioration graphic 62.

Figure 6:
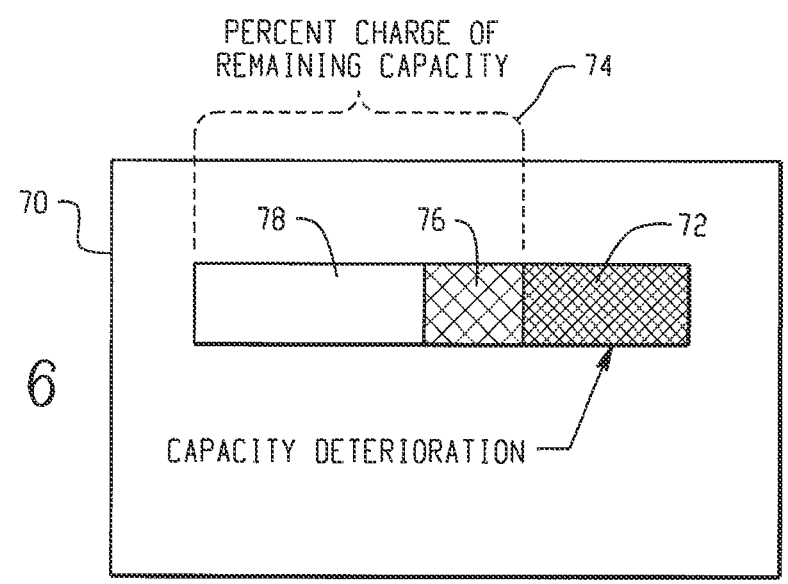

FIG. 6 depicts an example display 70 that shows both the amount of battery deterioration and the present charge of the battery. In this example, the portion 72 to the far right of the graphic is blacked out to indicate the capacity deterioration of the battery. The entire portion 74 of the graphic to the left of the blacked out portion 72 represents the remaining capacity of the battery. Of this remaining capacity 74, a portion 76 is grayed out to show the present charge on the battery. That is, the portion 78 of the graphic that his neither blacked out nor grayed out represents the present charge on the battery.

Figure 7:
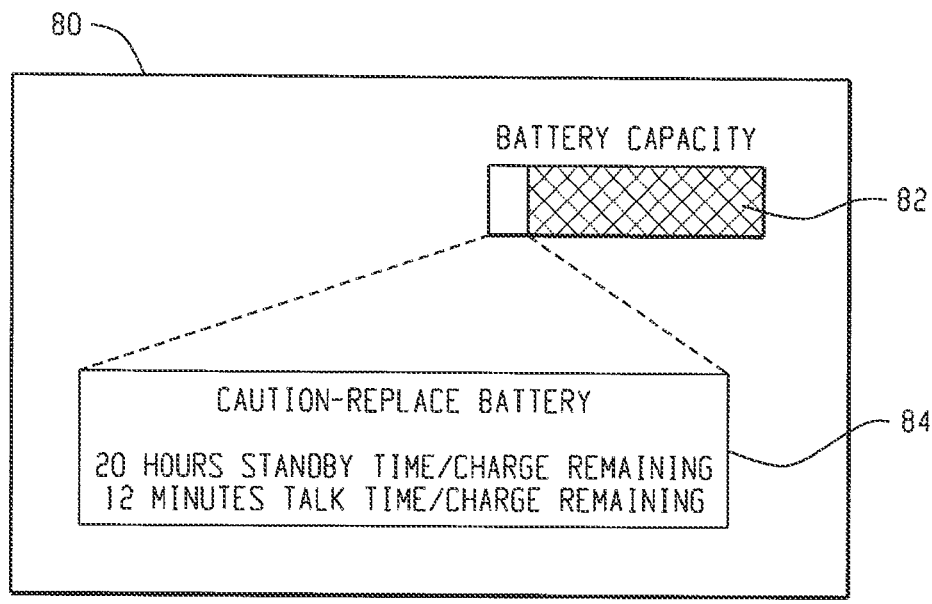
Figure 8:
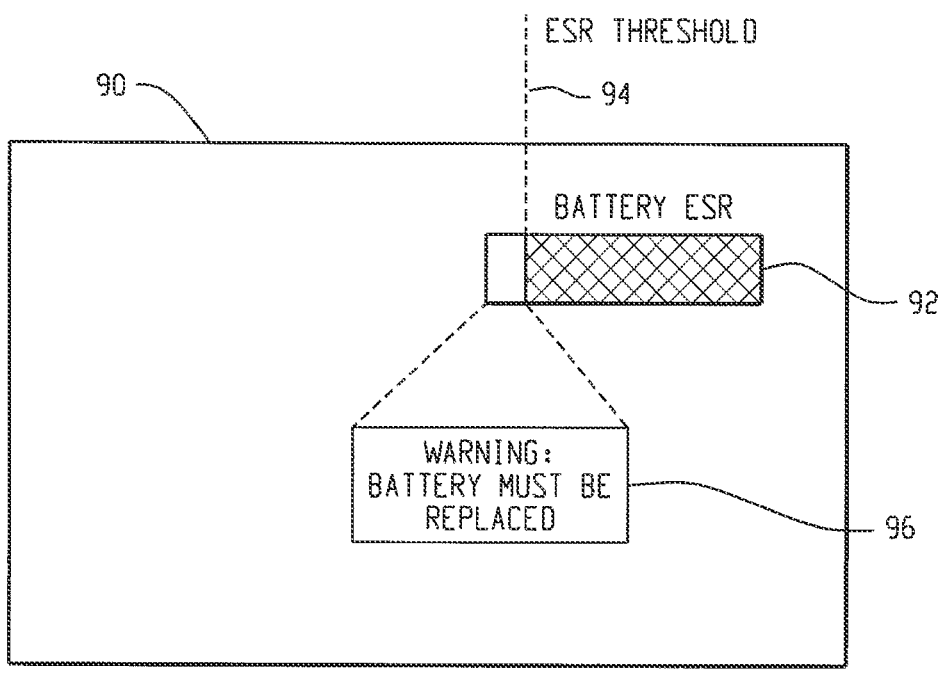

FIGS. 7 and 8 depict example displays 80, 90 that provide warning messages to a user based on the deterioration status of a battery performance characteristic. In the example shown in FIG. 8, the battery capacity has deteriorated to approximately 20% of its original capacity, as indicated by the deterioration status bar 82. As a result of the substantial deterioration to the battery capacity, a warning message 84 is displayed to the user. In this example, the message 84 advises the user that the full-charge capacity of the battery has deteriorated to an extent that only 20 hours of standby time and 12 minutes of talk time are available when the battery is fully charged. The message 84 therefore recommends replacing the battery. The warning message 84 may be generated when the battery capacity deteriorates below a predetermined threshold.

FIG. 8 illustrates another example based on the deterioration of the battery's ESR. In this example, the status bar 92 shows that the ESR of the battery has deteriorated to a predetermined threshold level 94. The predetermined threshold is an ESR level below which an operation of the device will not properly function. For example, a wireless mobile device, such as a cellular telephone, requires a certain minimum amount of current (mA) from the battery in order to operate. The minimum ESR threshold 94 may therefore represent the ESR value below which the battery in a wireless device will not have sufficient inrush current to operate the device. When the ESR deterioration reaches this predetermined threshold 94, a warning message 96 is generated indicating that the battery must be replaced.

Figure 9:
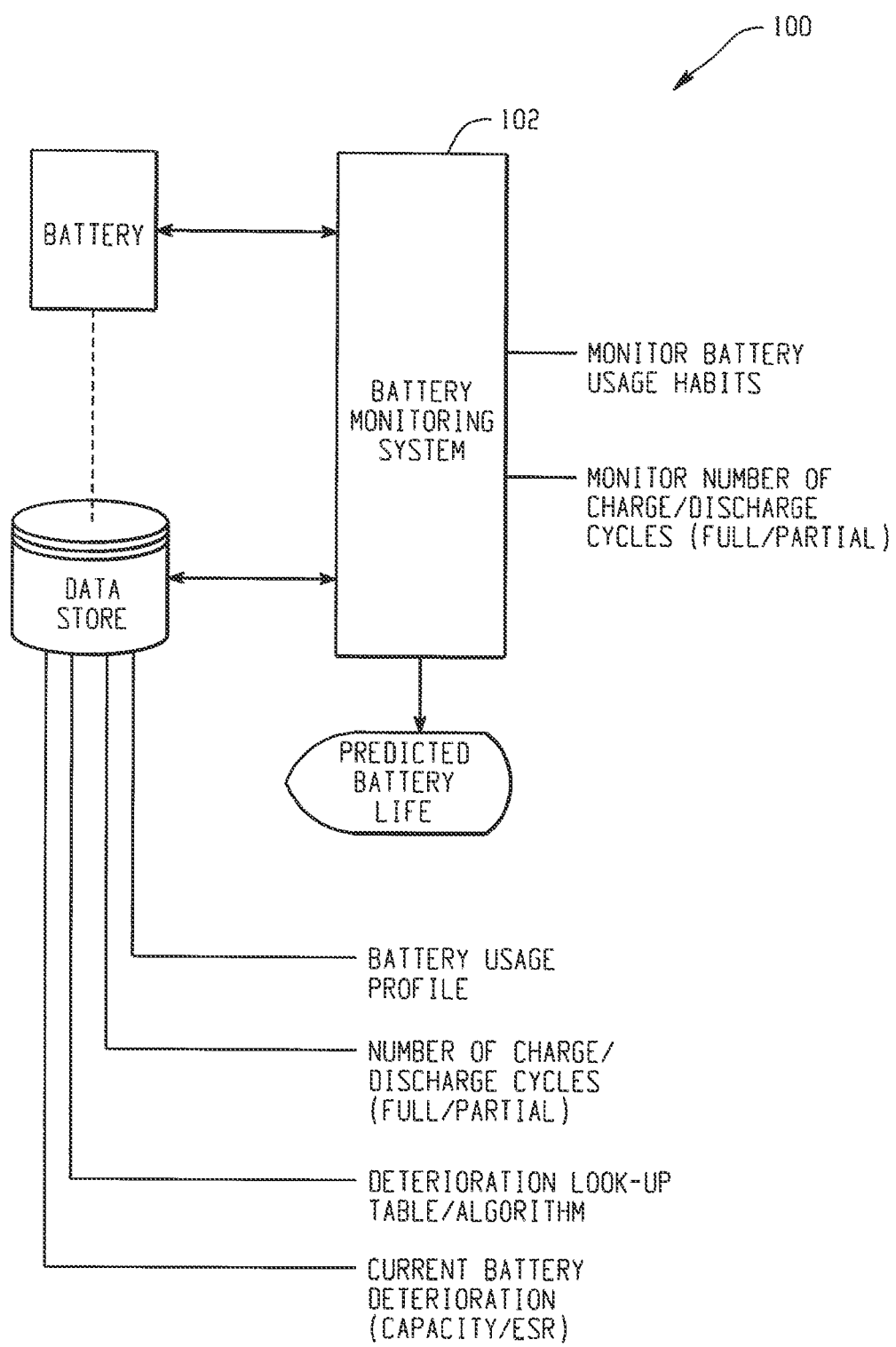
FIG. 9 is a block diagram of another example system for monitoring the deterioration of a rechargeable battery.

FIG. 9 is a block diagram of another example system 100 for monitoring the deterioration of a rechargeable battery. In this example, the battery monitoring system 102 predicts the remaining life of the battery by monitoring one or more battery deterioration events as well as monitoring the usage habits of the device owner. For example, the battery monitoring system 102 may record deterioration information to the data store 104, such as the number of charge and discharge cycles of the battery, whether the charge and discharge cycles where full or partial, and/or other environmental or operational factors that are relevant to the deterioration of the battery over time. In addition, the battery monitoring system 102 may track the usage habits of the device owner, such as how often the battery is charged on average, the average amount that the battery is discharged before being charged, and/or other usage information that is relevant to battery deterioration. The stored battery usage habit information may then be used along with the deterioration information to predict the amount of time remaining before the battery will need to be replaced.

Figure 10:
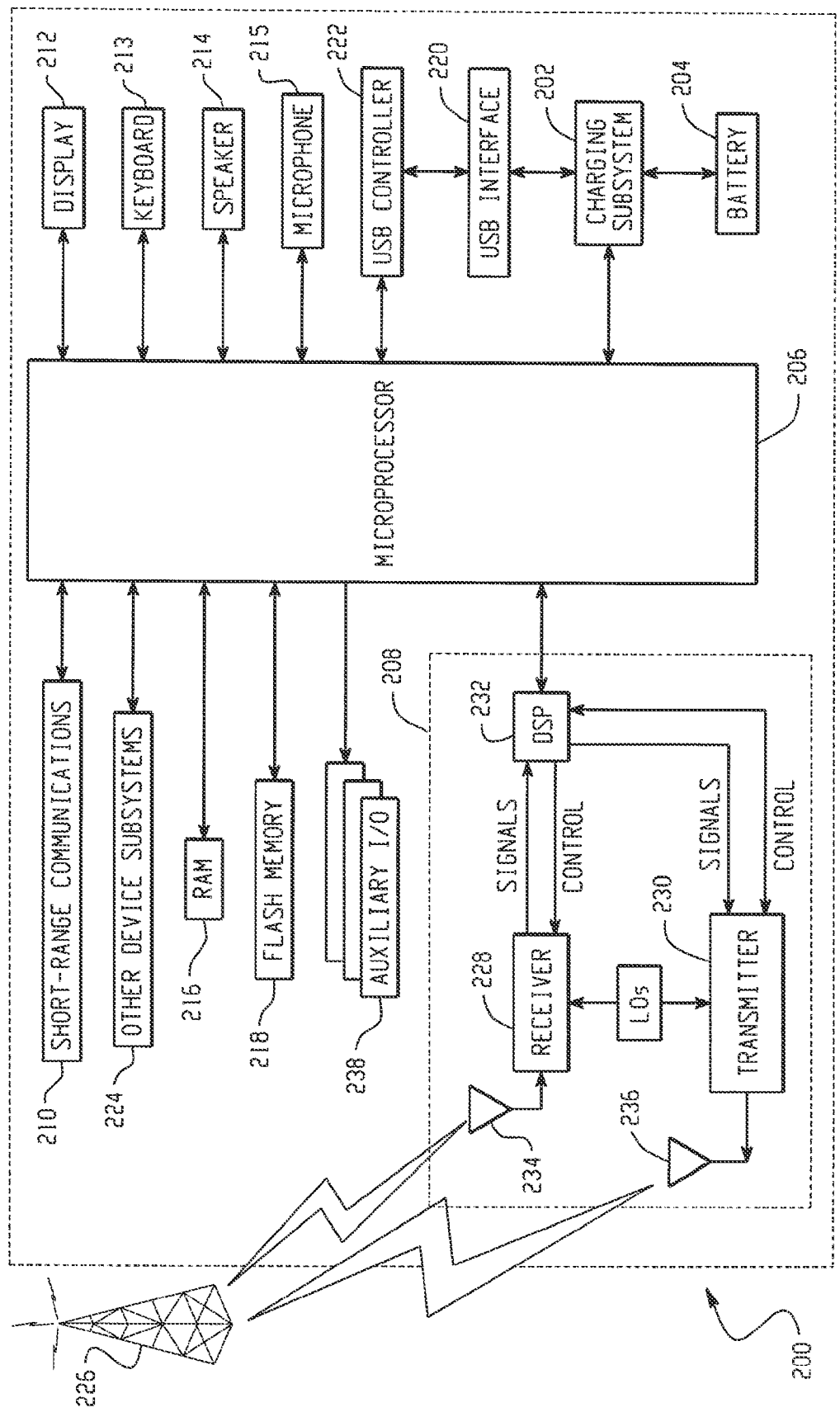
FIG. 10 is a block diagram of an example mobile device that may include a system for monitoring battery deterioration.

FIG. 10 is a block diagram of an example mobile device 200 that may include a system for monitoring battery deterioration. The mobile device 200 includes a charging subsystem 202 and a rechargeable battery 204. The charging subsystem 202 may include a battery monitoring system, as described herein. In addition, the rechargeable battery 204 may include an integrated memory device for storing battery deterioration information and/or other information pertaining to the battery 204. The mobile device 200 may also include a processing device 206, a communications subsystem 208, a short-range communications subsystem 210, input/output devices 212-215, memory devices 216, 218, a USB interface 220 and USB controller 22, and various other device subsystems 224.

In addition to monitoring battery deterioration, the charging subsystem 202 charges the rechargeable battery 204 and provides power to the mobile device 200, either from the rechargeable battery 204 or from a USB host connected to the USB interface 220. The USB controller 222 monitors the USB data lines, and controls data communication between the processing device 206 and a USB host.

The processing device 206 controls the overall operation of the mobile device 200. Operating system software executed by the processing device 206 is preferably stored in a persistent store such as a flash memory 218, but may also be stored in other types of memory devices, such as a read only memory (ROM) or similar storage element. In addition, operating system software, specific device applications, or parts thereof, may be temporarily loaded into a volatile store, such as a random access memory (RAM) 216. Communication signals received by the mobile device 200 may also be stored to RAM 216.

The processing device 206, in addition to its operating system functions, enables execution of software applications on the device 200. A predetermined set of applications that control basic device operations, such as data and voice communications, may be installed on the device 200 during manufacture. In addition, a personal information manager (PIM) application may be installed during manufacture. The PIM is preferably capable of organizing and managing data items, such as e-mail, calendar events, voice mails, appointments, and task items. The PIM application is also preferably capable of sending and receiving data items via the wireless network 226. Preferably, the PIM data items are seamlessly integrated, synchronized and updated via the wireless network 226 with the device user's corresponding data items stored or associated with a host computer system.

Communication functions, including data and voice communications, are performed through the communication subsystem 208, and possibly through the short-range communications subsystem 210. If the mobile device 200 is enabled for two-way communications, then the communication subsystem 200 includes a receiver 228, a transmitter 230, and a processing module 232, such as a digital signal processor (DSP). In addition, the communication subsystem 208, configured as a two-way communications device, includes one or more, preferably embedded or internal, antenna elements 234, 236, and local oscillators (LOs) 238. The specific design and implementation of the communication subsystem 208 is dependent upon the communication network 226 in which the mobile device 200 is intended to operate. Network access requirements vary depending upon the type of communication system 226.

When required network registration or activation procedures have been completed, the mobile device 200 may send and receive communication signals over the communication network 226. Signals received by the antenna 234 through the communication network 226 are input to the receiver 228, which may perform such common receiver functions as signal amplification, frequency down-conversion, filtering, channel selection, and analog-to-digital conversion. Analog-to-digital conversion of the received signal allows the DSP to perform more complex communication functions, such as demodulation and decoding. In a similar manner, signals to be transmitted are processed by the DSP 232, and are then input to the transmitter 230 for digital-to-analog conversion, frequency up-conversion, filtering, amplification and transmission over the communication network 208 via the antenna 236.

In addition to processing communication signals, the DSP 232 provides for receiver 228 and transmitter 230 control. For example, gains applied to communication signals in the receiver 228 and transmitter 230 may be adaptively controlled through automatic gain control algorithms implemented in the DSP 232.

In a data communication mode, a received signal, such as a text message or web page download, is processed by the communication subsystem 208 and input to the processing device 206. The received signal is then further processed by the processing device 206 for output to a display 212 (which may serve the function of the battery deterioration display 18 of FIG. 1), or alternatively to some other auxiliary I/O device 238. A device user may also compose data items, such as e-mail messages, using a keyboard 213, such as a QWERTY-style keyboard, and/or some other auxiliary I/O device 238, such as a touchpad, a rocker switch, a thumb-wheel, or some other type of input device. The composed data items may then be transmitted over the communication network 226 via the communication subsystem 208.

In a voice communication mode, overall operation of the device 200 is substantially similar to data communication mode, except that received signals are output to a speaker 214, and signals for transmission are generated by a microphone 215. Alternative voice or audio I/O subsystems, such as a voice message recording subsystem, may also be implemented on the device 200. In addition, the display 212 may also be utilized in voice communication mode, for example to display the identity of a calling party, the duration of a voice call, or other voice call related information.

The short-range communications subsystem 210 enables communication between the mobile device 200 and other proximate systems or devices, which need not necessarily be similar devices. For example, the short-range communications subsystem 210 may include an infrared device and associated circuits and components, or a Bluetooth™ communication module to provide for communication with similarly-enabled systems and devices.

Figure 11:
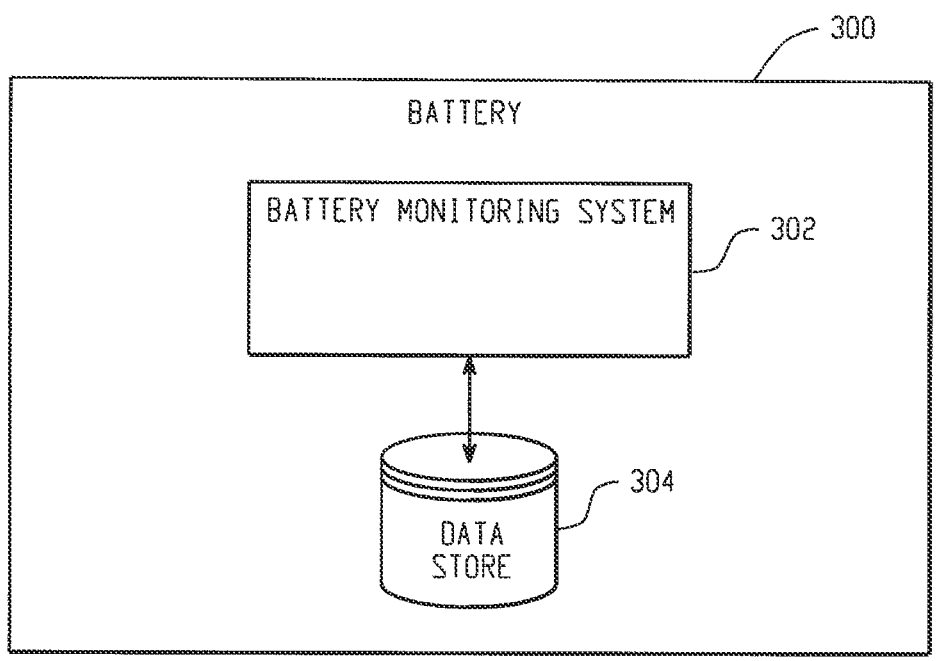
FIG. 11 depicts an example in which both the battery monitoring system and the data store are integral to the rechargeable battery.

This written description uses examples to disclose the invention, including the best mode, and also to enable a person skilled in the art to make and use the invention. The invention described herein may provide certain advantages, such as a more accurate approximation of battery deterioration, an enhanced information display for the benefit of the user, and/or other advantages. The patentable scope of the invention may include other examples that occur to those skilled in the art. For example, FIG. 11 depicts an example in which both the battery monitoring system 302 and the data store 304 are integral to the rechargeable battery 300. With an integral battery monitoring system 302, information relating to the storage and possibly charging of the battery 300 may be monitored and recorded even when the battery 300 has not been inserted into a mobile device. When the rechargeable battery 300 is inserted into a mobile device, the integral battery monitoring system 302 may communicate with systems within the mobile device to monitor charging, discharging and storage information and to cause information relating to battery deterioration to be displayed on the mobile device, as described above. In other examples, portions of the battery monitoring system may be included in the rechargeable battery and other portions may be included in the mobile device.

The invention claimed is:

1. A mobile device comprising:
a rechargeable battery; and
a battery monitoring system configured to monitor charging information, discharging information and storage information of the battery, the charging information including a number of charge cycles incurred by the battery, the discharging information including a number of discharge cycles incurred by the battery, and the storage information relating to periods when the battery is not being actively charged or discharged;
the battery monitoring system being further configured to approximate an extent of deterioration of an equivalent series resistance (ESR) of the battery based on the stored charging information, discharging information and storage information;
the battery monitoring system being further configured to display a graphical representation of the deterioration of the ESR, wherein the graphical representation includes a status bar indicating ESR, an indication on the status bar of the approximated deterioration of the ESR, and a line on the status bar representing a threshold ESR.

2. The mobile device of claim 1, wherein the charging information includes whether each of the charge cycles were full charge cycles or partial charge cycles.

3. The mobile device of claim 2, wherein the charging information further includes a degree to which the battery was charged during the partial charge cycles.

4. The mobile device of claim 1, wherein the storage information includes temperature of the battery during storage periods.

5. The mobile device of claim 1, wherein the storage information includes charge level during storage periods.

6. The mobile device of claim 1, wherein the approximation is further based on age of the battery.

7. The mobile device of claim 1, wherein the charging information includes rate of charge during the charge cycles.

8. The mobile device of claim 1, wherein the charging information includes rate of discharge during the discharge cycles.

9. The mobile device of claim 1, wherein the approximation is made using a look-up table stored in the mobile device.

10. The mobile device of claim 9, wherein the look-up table is specific to a chemical composition of the battery.

11. The mobile device of claim 1, wherein the battery monitoring system is further configured to provide a warning message when the indication on the status bar of the deterioration of the ESR reaches the line representing the threshold ESR.

12. A method performed by an electronic device that is powered by a rechargeable battery, the method comprising:

monitoring charging information, discharging information and storage information of the battery, the charging information including a number of charge cycles incurred by the battery, the discharging information including a number of discharge cycles incurred by the battery, and the storage information relating to periods when the battery is not being actively charged or discharged;

approximating an extent of deterioration of an equivalent series resistance (ESR) of the battery based on the charging information, the discharging information and the storage information; and predicting, by the electronic device, a remaining usable life of the battery based on usage habits of a user in using of the electronic device and how the usage habits affect ESR, the usage habits relating to information collected during charging, discharging and storage of the battery; and displaying an indication of the predicted remaining usable life of the battery.

13. The method of claim 12, wherein the charging, discharging and storage information includes temperature of the battery.

14. The method of claim 12, wherein the approximation is further based on an age of the battery.

15. A mobile device comprising:
a rechargeable battery; and
a battery monitoring system configured to monitor charging information, discharging information and storage information of the battery, the charging information including a number of charge cycles incurred by the battery, the discharging information including a number of discharge cycles incurred by the battery, and the storage information relating to periods when the battery is not being actively charged or discharged;

the battery monitoring system being further configured to approximate an extent of deterioration of an equivalent series resistance (ESR) of the battery based on the stored charging information, discharging information and storage information;

the battery monitoring system being further configured to monitor battery usage habits of a user in using the mobile device and to predict a remaining usable life of the battery based on the usage habits.

16. The mobile device of claim 15, wherein the charging information includes whether each of the charge cycles were full charge cycles or partial charge cycles.

17. The mobile device of claim 16, wherein the charging information further includes a degree to which the battery was charged during the partial charge cycles.

18. The mobile device of claim 15, wherein the storage information includes temperature of the battery during storage periods.

19. The mobile device of claim 15, wherein the storage information includes charge level during storage periods.

20. The mobile device of claim 15, wherein the approximation is further based on age of the battery.

21. The mobile device of claim 15, wherein the charging information includes rate of charge during the charge cycles.

22. The mobile device of claim 15, wherein the charging information includes rate of discharge during the discharge cycles.

23. The mobile device of claim 15, wherein the approximation is made using a look-up table stored in the mobile device.

24. The mobile device of claim 23, wherein the look-up table is specific to a chemical composition of the battery.

25. The mobile device of claim 15, wherein the battery monitoring system is further configured to display a graphical representation of the deterioration of the ESR.

26. The mobile device of claim 25, wherein the graphical representation includes a status bar indicating ESR, an indication on the status bar of the approximated deterioration of the ESR, and a line on the status bar representing a threshold ESR.

27. The mobile device of claim 26, wherein the battery monitoring system is further configured to provide a warning message when the indication on the status bar of the deterioration of the ESR reaches the line representing the threshold ESR.

28. The mobile device of claim 15, wherein the usage habits relate to how often the battery is charged on average.

29. The mobile device of claim 15, wherein the usage habits relate to an average amount that the battery is discharged before being charged.

* * * * *